United States Patent [19]
Matsumura et al.

[11] Patent Number: 5,633,829
[45] Date of Patent: May 27, 1997

[54] SERIAL ACCESS MEMORY DEVICE CAPABLE OF CONTROLLING ORDER OF ACCESS TO MEMORY CELL AREAS

[75] Inventors: Tetsuya Matsumura; Masahiko Yoshimoto, both of Hyogo-ken, Japan

[73] Assignee: Mitsubishi Denki Kabushiki Kaisha, Tokyo, Japan

[21] Appl. No.: 739,786

[22] Filed: Jul. 31, 1991

Related U.S. Application Data

[63] Continuation of Ser. No. 489,946, Mar. 9, 1990, abandoned.
[51] Int. Cl.$^6$ .................................................. G11C 7/00
[52] U.S. Cl. ................... 365/221; 365/78; 365/189.05; 365/230.08; 365/240
[58] Field of Search ............................ 365/78, 189.05, 365/221, 230.08, 240

[56] References Cited

U.S. PATENT DOCUMENTS

| | | | |
|---|---|---|---|
| 4,586,167 | 4/1986 | Fujishima et al. | 365/189.05 |
| 4,809,232 | 2/1989 | Gaumbaugh et al. | 365/221 |
| 4,823,302 | 4/1989 | Christopher | 365/221 |
| 4,832,302 | 5/1989 | Christopher . | |
| 4,961,169 | 10/1990 | Matsumura et al. . | |

FOREIGN PATENT DOCUMENTS 53-42643  4/1978  Japan .

OTHER PUBLICATIONS

A Memory–Based High–Speed Digital Delay Line With a Large Adjustable Length, Mattausch, et al., IEEE Journal of Solid–State Circuits, vol. 23, No. 1, Feb. 1988.

*Primary Examiner*—Joseph E. Clawson, Jr.
*Attorney, Agent, or Firm*—Lowe, Price, LeBlanc & Becker

[57] ABSTRACT

A serial access memory device is disclosed in which order of access to writing and reading memory cell columns can be controlled. A writing column selecting circuit and a reading column selecting circuit are each comprised of ring pointers with a controllable number of stages. The number of stages of the ring pointers is controlled in response to control signals stored in a serial interface circuit. As a result, two ring pointers each having two stages are formed in the writing column selecting circuit while one ring pointer having four stages is formed in the reading column selecting circuit. After two data signals are written in selected two memory cell columns in parallel, written data signals are read out from serially selected four memory cell columns at a speed twice that in the writing. This serial access memory device is applied to a progressive scan conversion circuit for video signal processing.

24 Claims, 10 Drawing Sheets

SERIAL ACCESS MEMORY DEVICE CAPABLE OF CONTROLLING ORDER OF ACCESS TO MEMORY CELL AREAS

This application is a Continuation; application of application Ser. No. 07/489,946, filed Mar. 9, 1990, now abandoned.

BACKGROUND OF THE INVENTION

1. Field of the Invention

The present invention generally relates to serial access memory devices, and more particularly, to a serial access device capable of controlling order of access to memory cell areas. The present invention has particular applicability to a progressive scan conversion circuit and an RGB line memory device for video signal processing.

2. Description of the Related Art

In recent years, semiconductor memory devices have come to be applied to a variety of electronic equipment. Correspondingly, there is an increasing demand not only for general-purpose semiconductor memory devices but for those suited to video signal processing or picture processing for example. Therefore, in order to perform video signal processing or picture processing, a semiconductor memory device capable of serially inputting/outputting data signals that constitute a video image or picture ("serial access memory device") is required.

Figure 1:
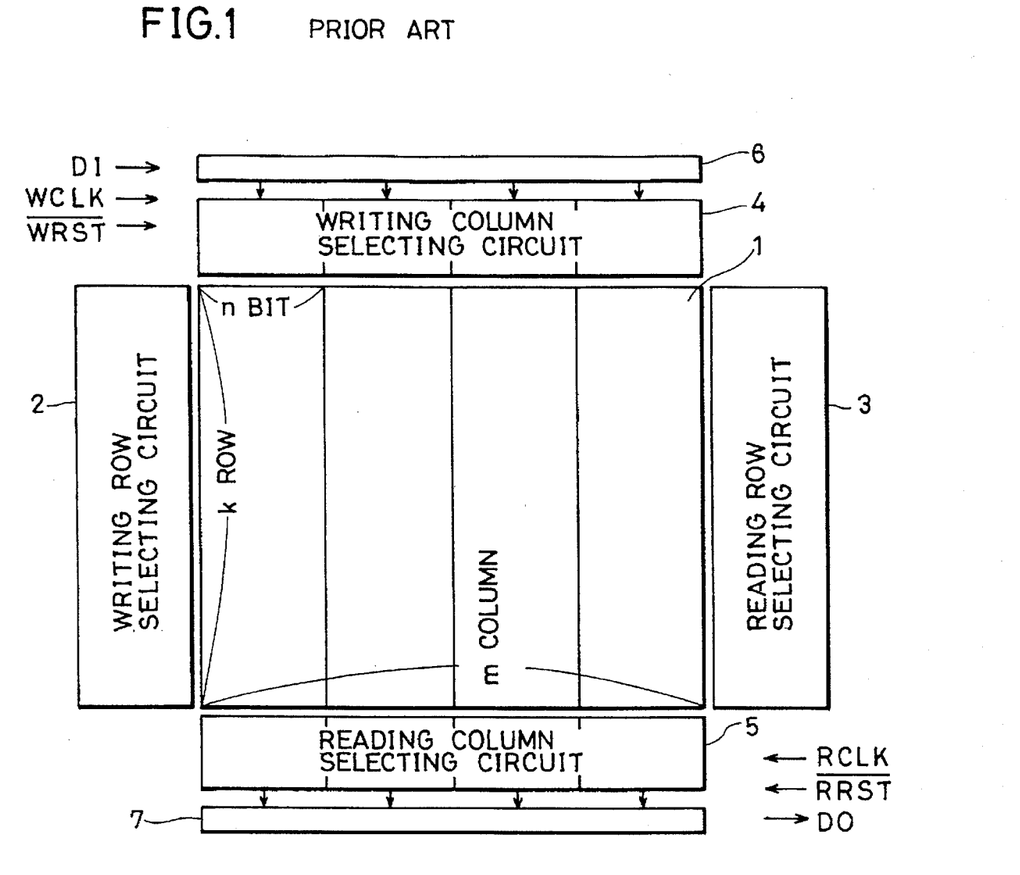
FIG. 1 is a block diagram of a conventional serial access memory device.

FIG. 1 is a block diagram of a conventional serial access memory device. Referring to the diagram, this memory device comprises a memory cell array 1 including memory cells of n bits by k rows by m columns, a writing row selecting circuit 2 for serially selecting a row in the memory cell array 1 to which data are to be written, a reading row selecting circuit 3 for serially selecting a row in the memory cell array 1 from which data are to be read out, writing column selecting circuit 4 for serially selecting a column in the memory cell array 1 to which data are to be written, and a reading column selecting circuit 5 for serially selecting a column in the memory cell array 1 from which data are to be read out. These selecting circuit 2, 3, 4 and 5 are generally constituted of ring pointer circuits.

An n-bit input data bus 6 is connected to the memory cell array 1 through an input bus selector circuit. The input data bus 6 has n input data lines. The n input data lines supply n-bit input data in parallel to each column provided in the memory cell array 1. In the writing operation, the thus supplied n-bit input data are written in memory cells disposed in the row selected by the writing row selecting circuit 2 and in the column selected by the writing column selecting circuit 4.

An output data bus 7 is connected to the memory cell array 1 through an output bus selector circuit. The output data bus 7 has n output data lines. The output data bus 7 is connected to the memory cell array 1 to receive n-bit data read out from each column in the memory cell array 1. In the reading operation, n-bit data are read out from memory cells in the row selected by the reading row selecting circuit 3 and in the column selected by the reading column selecting circuit 5 and then applied to the output data bus 7.

Addressing for a writing operation is reset in response to an externally applied write reset signal $\overline{WRST}$. After the writing address has been reset, the first column is selected by the writing column selecting circuit 4. One of the rows in the selected first column is selected, in response to a writing clock signal WCLK, serially, allowing data on the input data bus 6 to be written therein. The writing column selecting circuit 4 serially selects one of the columns in the memory cell array 1. When the last m-th column is selected by the writing column selecting circuit 4, the first column is selected again. Thereafter, the column and row selection for the writing is repeated, whereby data on the input data bus 6 for the writing are serially written in the memory cell array 1.

The writing row selecting circuit 2 and the writing column selecting circuit 4 select, in response to the writing clock signal WCLK, a row and a column for the writing. Similarly, the reading row selecting circuit 3 and the reading column selecting circuit 5 select, in response to a reading clock signal RCLK, a row and a column in the memory cell array 1 from which data are to be read out. From the memory cells of the selected row and column, data that have been stored therein are serially read out and applied to the output data bus 7.

Assuming now that the memory cell array 1 shown in FIG. 1 has a circuit structure of n=8, k=182 and m=5, this serial access memory device can be applied to an asynchronous line memory in an NTSC color television for video signal processing.

Figure 2:
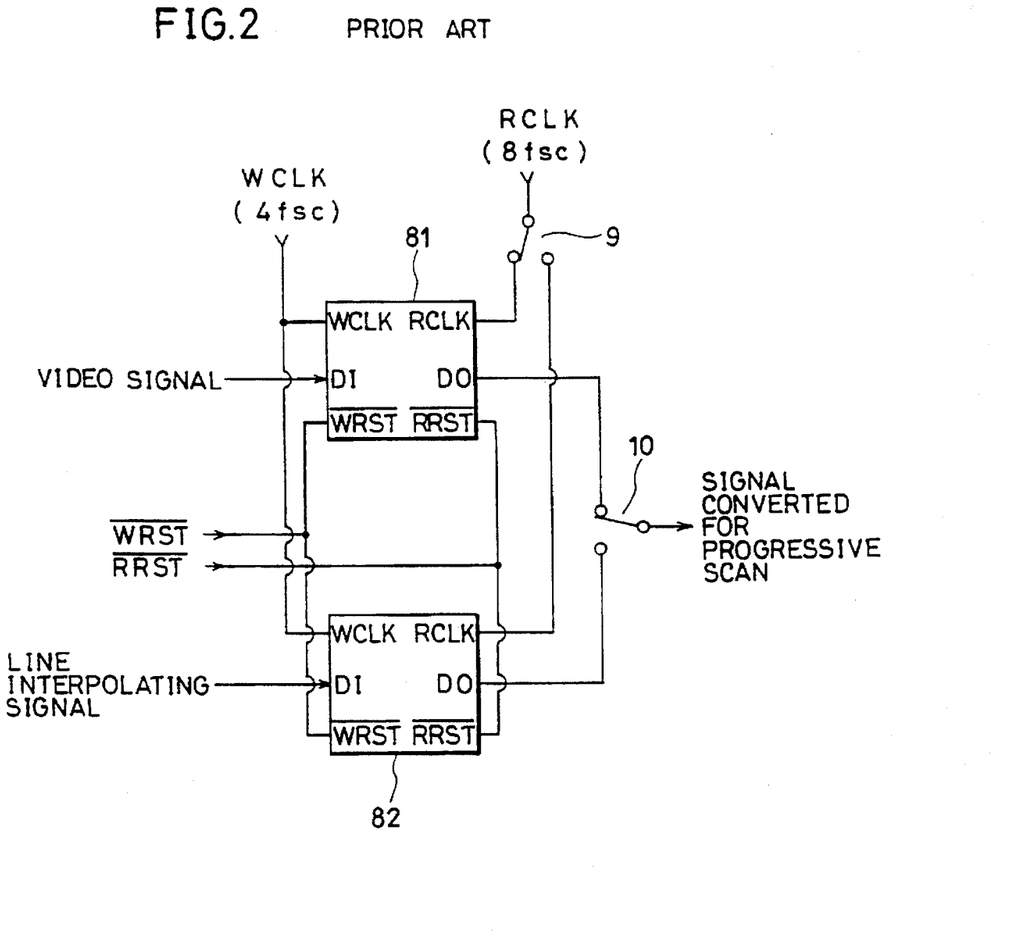
FIG. 2 is a block diagram of a conventional progressive scan conversion circuit for video signal processing.

FIG. 2 is a block diagram of a progressive scan conversion circuit for video signal processing, using two of the serial access memory device shown in FIG. 1. Referring to the diagram, this progressive scan conversion circuit comprises two serial access memory devices 81 and 82 provided on a single semiconductor chip. Each of the memory devices 81 and 82 is connected to receive the writing clock signal WCLK, the reading clock signal RCLK, the writing reset signal $\overline{WRST}$ and a reading reset signal $\overline{RRST}$. The memory device 81 is connected to receive video signals with its data input DI. The memory device 82 is connected to receive line interpolating signals with its data input DI. A switching circuit 10 is connected between data outputs DOs of the memory devices 81 and 82. Video signals that have been doubled in speed (or converted for progressive, rather than interlaced, scan) are outputted through the switching circuit 10. Another switching circuit 9 supplies the reading clock signal RCLK to the memory devices 81 and 82 alternately.

The "progressive scan conversion" is required to double the number of scanning lines in one field. Accordingly, the writing clock signal WCLK has a frequency of 14.3 MHz (equivalent to fourfold the color subcarrier frequency $f_{SC}$). The serial access memory device 81 is responsive to the clock signal WCLK for receiving an A/D-converted 8-bit video signal. The serial access memory device 82 is responsive to the clock signal WCLK for receiving a line interpolating signal. After the writing is effected on over half of all the data (455 samples), data stored in the memory devices 81 and 82 are alternately read out, based on switching control by the switching circuits 9 and 10. The reading clock signal RCLK has a frequency of twice that of the writing clock signal WCLK, or 28.6 MHz. The reading clock signal RCLK is supplied to the memory devices 81 and 82 alternately through the switching circuit 9 so that those data read out from the memory devices 81 and 82 are outputted through the switching circuit 10 as signals converted for progressive scan.

As described above, a conventional progressive scan conversion circuit for video signal processing requires two serial access memory devices. Accordingly, the total memory capacity required in the memory devices 81 and 82 is increased. In addition, it is to be noted that non-preparedness of any redundancy circuit leads to a low yield.

Therefore, if only one memory cell has any defect for example, the whole memory device will be inevitably regarded as a defective. This results in a decreased productive efficiency.

Furthermore, since the switching circuits 9 and 10 are required for control of the two memory devices 81 and 82, control of these switching circuits 9 and 10 and the whole circuit structure are complicated. It has been pointed out that these inconveniences result from functional inflexibility of the serial access memory device shown in FIG. 1 in which order of access is fixed in advance.

SUMMARY OF THE INVENTION

An object of the present invention is to use with flexibility memory cell areas in a serial access memory device.

Another object of the present invention is to control order of access to memory cell areas in a serial access memory device.

Still another object of the present invention is to control order of selecting memory cell columns in a serial access memory device.

A further object of the present invention is to improve yield of a serial access memory device.

Still a further object of the present invention is to provide a redundancy circuitry in a serial access memory device.

A further object of the present invention is to simplify circuit structure and circuit control of a progressive scan conversion circuitry for video signal processing.

Still a further object of the present invention is to reduce memory capacity required in a progressive scan conversion circuitry for video signal processing.

A further object of the present invention is to provide a progressive scan conversion circuitry for video signal processing which is constituted of a single serial access memory.

Still a further object of the present invention is to provide a line memory device for the R, G and B signals which is constituted of a single serial access memory.

Briefly stated, a serial access memory device according to the present invention comprises a plurality of separately accessible memory cell areas, a plurality of access circuits each having access to a memory cell area, a plurality of activating circuits each activating an access circuit in response to an externally applied clock signal, a storage circuit storing a selecting signal for selecting at least two of the activating circuits, and a selecting circuit selecting at least two of the activating circuits in response to the stored selecting signal.

In operation, the selecting circuit selects at least two of the activating circuits in response to the selecting signal stored in the storage circuit. The selected activating circuits activate, in response to the clock signal, the corresponding access means serially. Since order of access to the memory cell areas by the access circuits can be controlled in this manner, the memory cell areas can be flexibly used.

According to a preferred embodiment of the present invention, the plurality of memory cell areas comprise a plurality of memory cell columns which are separately accessible.

According to another preferred embodiment of the present invention, the plurality of activating circuits comprise a plurality of pointer elements which constitute ring pointers operative in response to the clock signal. The selecting circuit selects, in response to the stored selecting signal, at least two of the pointer elements. The at least two selected pointer elements constitute a ring pointer. The ring pointer selects, in response to the clock signal, at least two corresponding access circuits serially.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 3:
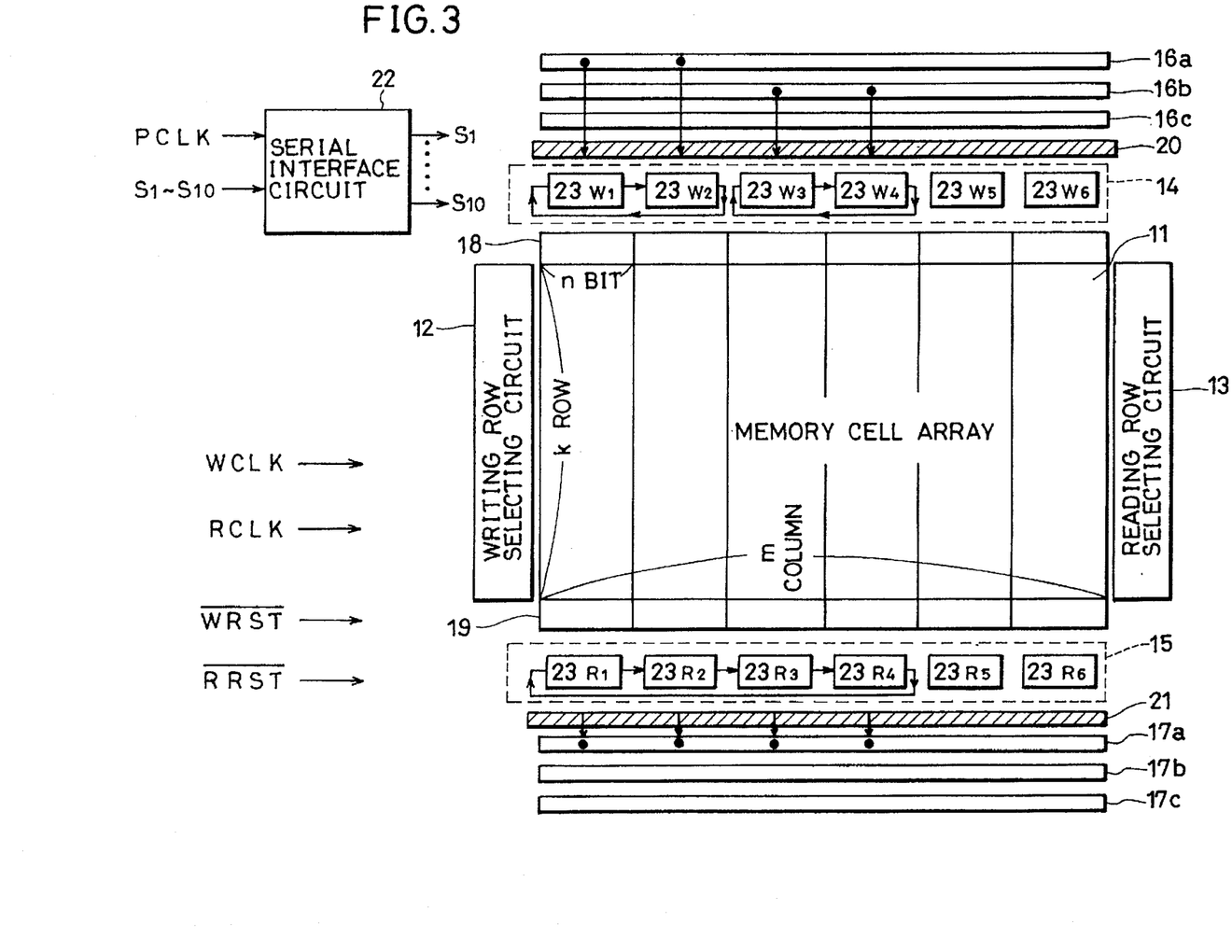
FIG. 3 is a block diagram of a serial access memory device according to an embodiment of the present invention.

Referring to FIG. 3, a serial access memory device according to the present invention comprises a memory cell array 11 having memory cells of n bits by k rows by m columns disposed therein, a writing row selecting circuit 12 for serially selecting a row to which data are to be written, a reading row selecting circuit 13 for serially selecting a row from which data are to be read out, a writing column selecting circuit 14 for selecting a column to which data are to be written, a reading column selecting circuit 15 for selecting a column from which data are to be read out, and a serial interface circuit 22 for programming in advance the selection control by the selecting circuits 14 and 15. The writing column selecting circuit 14 is connected to a bit-line driving circuit 18. The reading column selecting circuit 15 is connected to a sense amplifier circuit 19. Each of data input buses 16a, 16b and 16c has n data lines. An input bus to be connected to the memory cell array 11 is selected by an input bus selector circuit 20. Similarly, each of output data buses 17a, 17b and 17c has n data lines. An output data bus to be connected to the memory cell array 11 is selected by an output bus selector circuit 21. In order to control the column selection in this serial access memory device, a writing clock signal WCLK, a reading clock signal RCLK, a clock signal PCLK for programming control signals, a writing reset signal $\overline{WRST}$, a reading reset signal $\overline{RRST}$ and control signals S1 through S10 are supplied from the outside.

The bit-line driving circuit 18 is responsive to an output signal from the writing column selecting circuit 14 for separately and selectively driving bit lines of each column of memory cells provided in the memory array 11. Similarly, the sense amplifier circuit 19 is responsive to an output signal from the reading column selecting circuit 15 for separately and selectively amplifying data signals on the bit lines of each memory cell column. The serial interface circuit 22 is responsive to the clock signal for programming PCLK for receiving and holding the control signals S1 to S10 which control the serial access memory device. The held control signals S1 through S10 are supplied to the writing column selecting circuit 14, the reading column selecting circuit 15, the input bus selector circuit 20 and the output bus selector circuit 21.

Figure 4A:
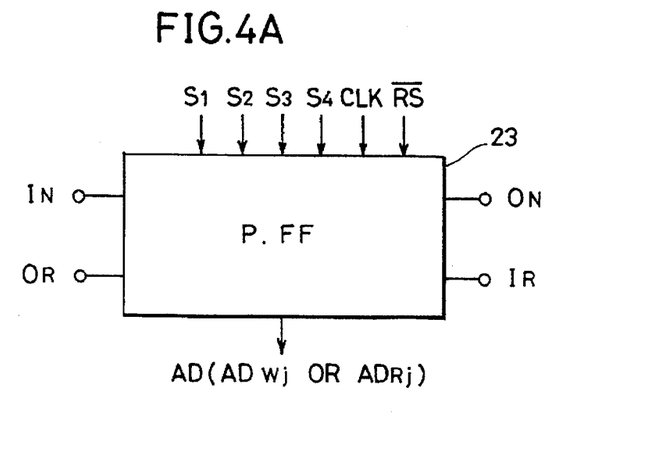
FIG. 4A is a block diagram of one programmable flip-flop shown in FIG. 3.

Each of the writing column selecting circuit 14 and the reading column selecting circuit 15 is constituted of cascade-connected flip-flops 23 one of which is shown in FIG. 4A. Referring to FIG. 4A, the flip-flop 23 is responsive to the control signals S1 to S4 held in and supplied from the serial interface circuit 22 for being controlled with respect to its circuit connection. Since this flip-flop has its circuit connection altered according to the signals S1 to S4 programmed in the serial interface circuit 22, it is called a programmable flip-flop (P. FF). One flip-flop 23 is, as shown in FIG. 4A, connected to receive the control signals S1 to S4, a clock signal CLK and a reset signal $\overline{RS}$. An input terminal $I_N$ is connected to receive a slave output of a flip-flop in the preceding stage. An output terminal $O_N$ applies its own slave output to a flip-flop in the subsequent stage. Another input terminal $I_R$ is connected to receive a returning signal from the flip-flop in the subsequent stage. Another output terminal $O_R$ applies its own returning signal to the flip-flop in the preceding stage. The flip-flop 23 outputs an enable signal for enabling or activating the bit-line driving circuit 18 or the sense amplifier circuit 19 for one column.

In the writing column selecting circuit 14, six flip-flops 23 as shown in FIG. 4A are cascade-connected through the terminals $I_N$, $O_R$, $O_N$ and $I_R$. The cascaded flip-flops 23 constitute a ring pointer. The input terminal $I_N$ and the output terminal $O_R$ of the first stage flip-flop $23_{W1}$ shown in FIG. 3 are brought into the floating state. In addition, the output terminal $O_N$ and the input terminal $I_R$ of the sixth stage flip-flop $23_{W6}$ are brought into the floating state. Similarly, the reading column selecting circuit 15 comprises cascade-connected six flip-flops $23_{R1}$ through $23_{R6}$ constituting a ring pointer.

Figure 4B:
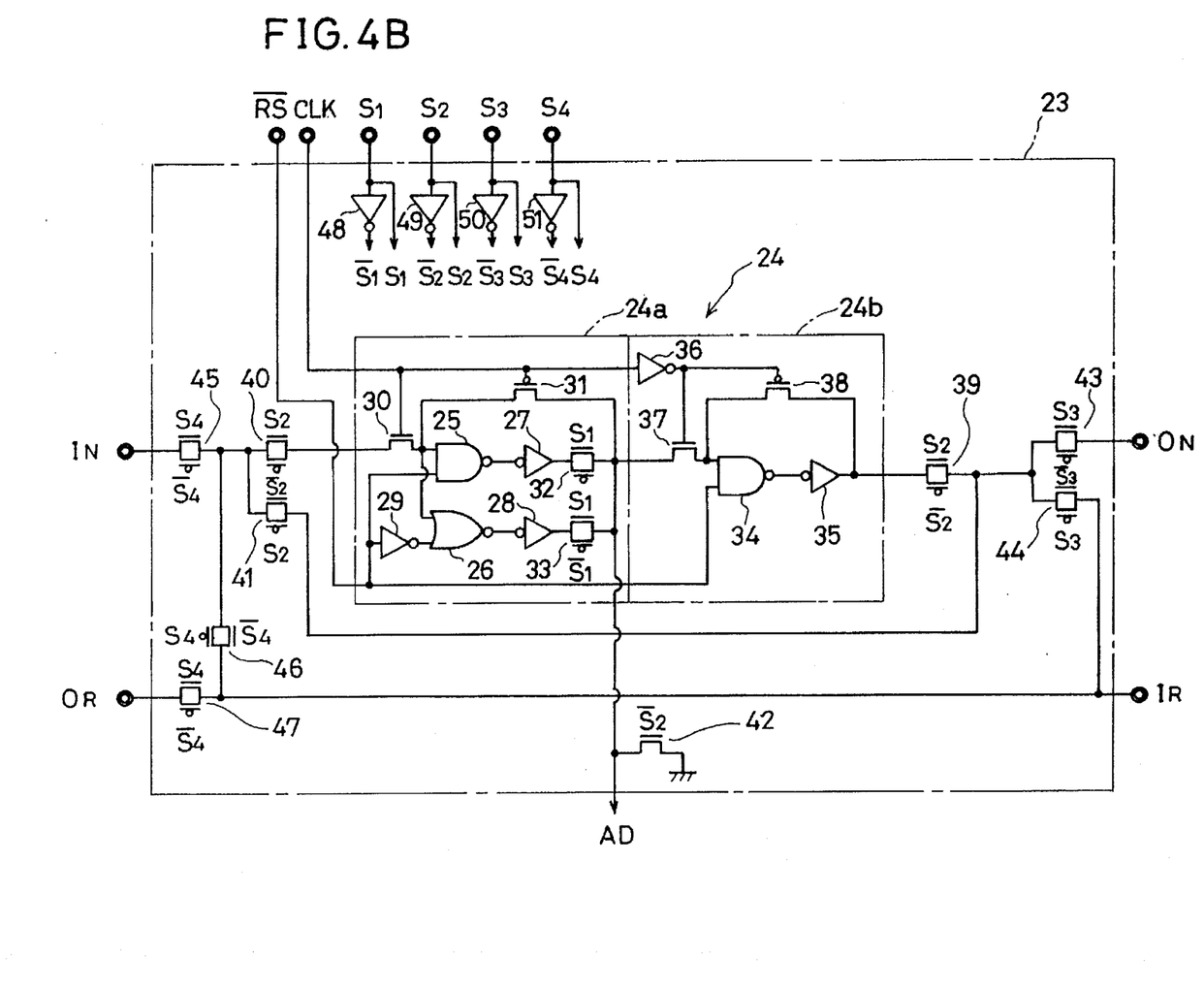
FIG. 4B is a circuit diagram of a programmable flip-flop shown in FIG. 3.

A detailed circuit diagram of the programmable flip-flop shown in FIG. 4A is given in FIG. 4B. Referring to FIG. 4B, the programmable flip-flop 23 comprises a master latch circuit 24a and a slave latch circuit 24b. The master latch circuit 24a comprises a NAND gate 25, a NOR gate 26, inverters 27, 28 and 29, an NMOS transistor 30, a PMOS transistor 31, and CMOS transmission gates 32 and 33. When the reset signal $\overline{RS}$ is entered through a reset input terminal, the master latch circuit 24a outputs, in response to the control signal S1, a signal of "H" or "L" as the master output. On the other hand, when the reset signal $\overline{RS}$ is not applied, the master latch circuit 24a operates as a normal static shift register irrespective of level of the control signal S1 applied to the transmission gates 32 and 33.

The slave latch circuit 24b accepts a data signal in response to rise of an inverted signal of a clock signal CLK (for example, the writing clock WCLK or the reading clock RCLK). This slave latch circuit 24b comprises a NAND gate 34, inverters 35 and 36, an NMOS transistor 37 and a PMOS transistor 38. When the reset signal $\overline{RS}$ is applied, the slave latch circuit 24b outputs a signal of "H" as slave output. On the other hand, when the reset signal $\overline{RS}$ is not applied, it operates as a normal static shift resistor.

The programmable flip-flop 23 further comprises CMOS transmission gates 39, 40 and 41 and a CMOS transistor 42 which are operative in response to the control signal S2, CMOS transmission gates 43 and 44 operative in response to the control signal S3, CMOS transmission gates 45, 46 and 47 operative in response to the control signal S4. Inverted signals $\overline{S1}$ to $\overline{S4}$ required for controlling the respective transmission gates are obtained through inverters 48 to 51, respectively. The programmable flip-flop 23 shown in FIG. 4B operates in response to the control signals S1 to S4 as shown in the following table 1.

TABLE 1

| | H | L |
|---|---|---|
| S1 | When reset signal is entered, master output is raised to "H". | When reset signal is entered, master output is turned down to "L". |
| S2 | Input signal is applied to master latch 24a of flip-flop 24. | Input signal is outputted as slave signal without passing through flip-flop 24. |
| S3 | Slave output is outputted through slave output terminal $O_N$. | Slave output is returned to input terminal $I_R$ of the same flip-flop. |
| S4 | Signal applied to input terminal $I_N$ is accepted as input signal. | Signal applied to input terminal $I_R$ is accepted as input signal. |

The control signal S1 is used for loading initial data in the flip-flop 23. The other control signals S2 to S4 are used for controlling data transfer paths between the flip-flops connected in the preceding and subsequent stages of the flip-flop 23. Assume for example that six programmable flip-flops $23_{W1}$ through $23_{W6}$ are cascaded in the writing column selecting circuit 14, as shown in FIG. 3. For the respective flip-flops $23_{W1}$ though $23_{W6}$, the control signals S1 to S4 are set as shown in the following table 2.

TABLE 2

| | P. FF | S1 | S2 | S3 | S4 | S5 | S6 | S7 | S8 | S9 | S10 |
|---|---|---|---|---|---|---|---|---|---|---|---|
| WRITING | | | | | | | | | | | |
| 1 column | $23_{W1}$ | 1 | 1 | 1 | 0 | 1 | 0 | 0 | | | |
| 2 column | $23_{W2}$ | 0 | 1 | 0 | 1 | 1 | 0 | 0 | | | |
| 3 column | $23_{W3}$ | 1 | 1 | 1 | 0 | 0 | 1 | 0 | | | |
| 4 column | $23_{W4}$ | 0 | 1 | 0 | 1 | 0 | 1 | 0 | | | |
| 5 column | $23_{W5}$ | X | 0 | 1 | 1 | 0 | 0 | 0 | | | |
| 6 column | $23_{W6}$ | X | 0 | 0 | 1 | 0 | 0 | 0 | | | |
| READING | | | | | | | | | | | |
| 1 column | $23_{R1}$ | 1 | 1 | 1 | 0 | | | | 1 | 0 | 0 |
| 2 column | $23_{R2}$ | 0 | 1 | 1 | 1 | | | | 1 | 0 | 0 |
| 3 column | $23_{R3}$ | 0 | 1 | 1 | 1 | | | | 1 | 0 | 0 |
| 4 column | $23_{R4}$ | 0 | 1 | 0 | 1 | | | | 1 | 0 | 0 |
| 5 column | $23_{R5}$ | X | 0 | 1 | 1 | | | | 0 | 0 | 0 |
| 6 column | $23_{R6}$ | X | 0 | 0 | 1 | | | | 0 | 0 | 0 |

In the table 2, value "1" represents "H" and value "0" represents "L". "X" represents that either "H" or "L" will do. For the flip-flop $23_{W1}$, since both of the applied control signals S2 and S3 are "H", an input signal is latched and a slave output is applied to the flip-flop $23_{W2}$ in the subsequent stage. The flip-flop $23_{W2}$ receives, in response to "H" of the control signal S4, the signal outputted from the flip-flop $23_{W1}$ in the preceding stage, and latches, in response to "H" of the signal S2, the received signal. Since the control signal S3 is "L", however, the slave output of the flip-flop $23_{W2}$ is not applied to the flip-flop $23_{W3}$ in the subsequent stage but returned to the input terminal $I_R$ of the flip-flop $23_{W2}$. Additionally, since the control signal S4 is "H", the returned slave output signal is transmitted to the output terminal $O_R$ through the transmission gate 47 shown in FIG. 4B.

As described above, the output terminal $O_R$ is connected to the input terminal $I_R$ of the flip-flop $23_{W1}$ in the preceding stage. Since the flip-flop $23_{W1}$ has received the control signal S4 of "L", it accepts the signal applied to the input terminal $I_R$ as an input signal. As a result, the two flip-flops $23_{W1}$ and $23_{W2}$ constitute a ring pointer with two stages, as shown in FIG. 3. Similarly, the programmable flip-flops $23_{W3}$ and $23_{W4}$ constitute another ring pointer with two stages. The remaining two programmable flip-flops $23_{W5}$ and $23_{W6}$ have received together the control signal S2 of "L" so that their latching function has been disabled. Therefore, they do not contribute to any substantial operation of the serial access memory device.

For the six programmable flip-flops $23_{R1}$ through $23_{R6}$ provided in the reading column selecting circuit 15, the control signals S1 to S4 shown in the table 2 above are set. As a result, a ring pointer comprising four stages of the flip-flops $23_{R1}$ to $23_{R4}$ is constituted. Since the remaining flip-flops $23_{R5}$ and $23_{R6}$ have been disabled, they do not contribute to any substantial operation.

Figure 5A:
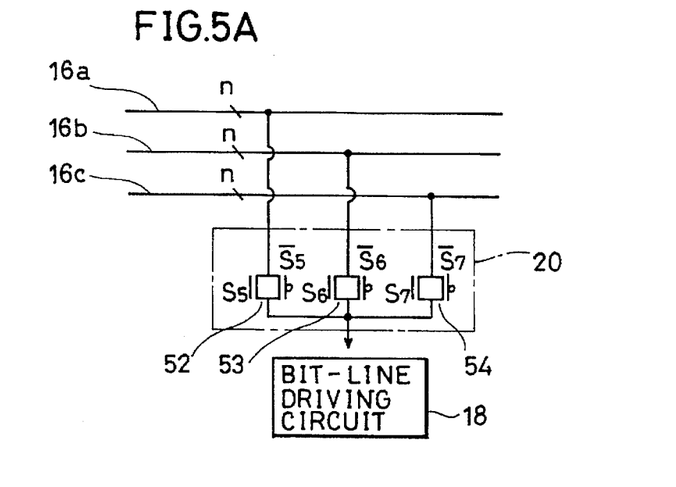
FIG. 5A is a circuit diagram of the input bus selector circuit shown in FIG. 3.
Figure 5B:
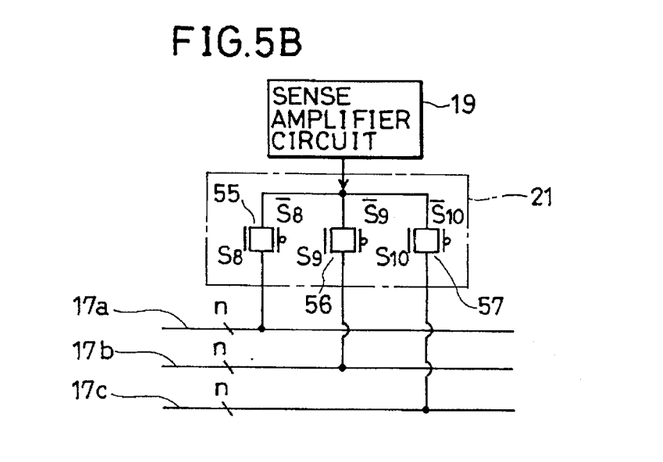
FIG. 5B is a circuit diagram of the output bus selector circuit shown in FIG. 3.

Details of the input bus selector circuit 20 and the output bus selector circuit 21 shown in FIG. 3 are given in FIGS. 5A and 5B, respectively. Referring to FIG. 5A, each of the n input bus selector circuits 20 comprises transmission gates 52, 53 and 54. The n transmission gates 52 are connected to the input data bus 16a and responsive to the signal S5 for operation. The n transmission gates 53 are connected to the input bus 16b and responsive to the control signal S6 for operation. The n transmission gates 54 are connected to the input data bus 16c and responsive to the control signal S7 for operation. Therefore, an input data bus selected by any of the transmission gates 52, 53 and 54 is connected to the bit-line driving circuit 18.

The output bus selector circuit 21 shown in FIG. 5B also has a circuit similar to the above. That is, transmission gates 55, 56 and 57 provided in each of the n output bus selector circuits 21 are responsive to the control signals S8, S9 and S10 for operation. Therefore, a selected output data bus is connected to the sense amplifier circuit 19.

Figure 6:
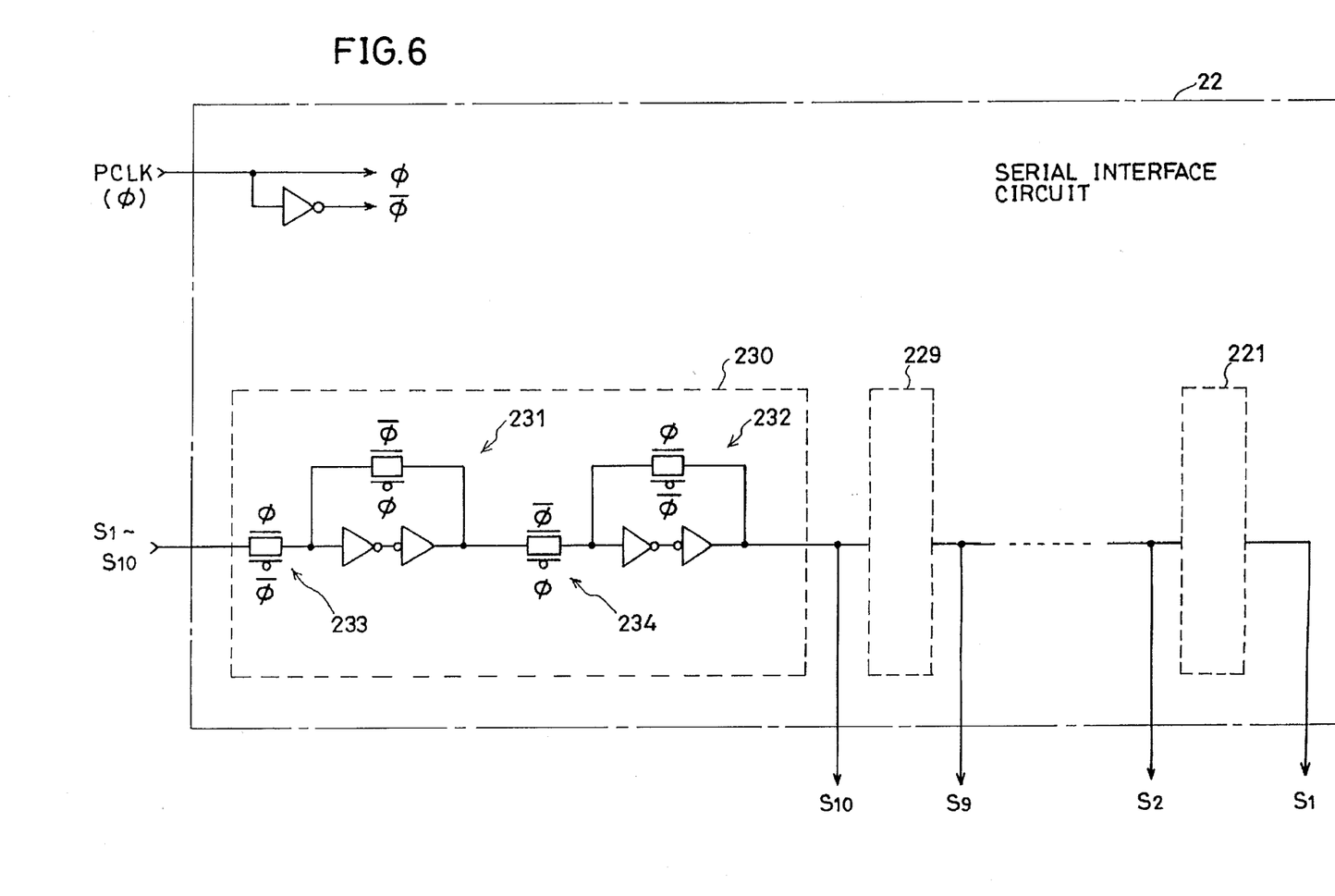
FIG. 6 is a circuit diagram of the serial interface circuit shown in FIG. 3.

Details of the serial interface circuit shown in FIG. 3 are given in FIG. 6. Referring to FIG. 6, the serial interface circuit 22 comprises ten cascaded shift registers 221 through 230. The shift registers 221 through 230 have like circuits. For example, the shift register 230 comprises a master latch 231, a slave latch 232, and CMOS transmission gates 233 and 234 for transmitting data signals.

In operation, a clock signal PCLK (φ) for programming and the control signals S1 to S10 to be programmed are applied from the outside. The shift register comprised of the registers 221 through 230 is responsive to the clock signal φ for serially shifting the applied control signals S1 to S10. Accordingly, the programmed control signals S1 to S10 are outputted though connection nodes between the registers. It is to be noted that the above-mentioned programming is executed prior to the reading and writing operations.

Figure 7:
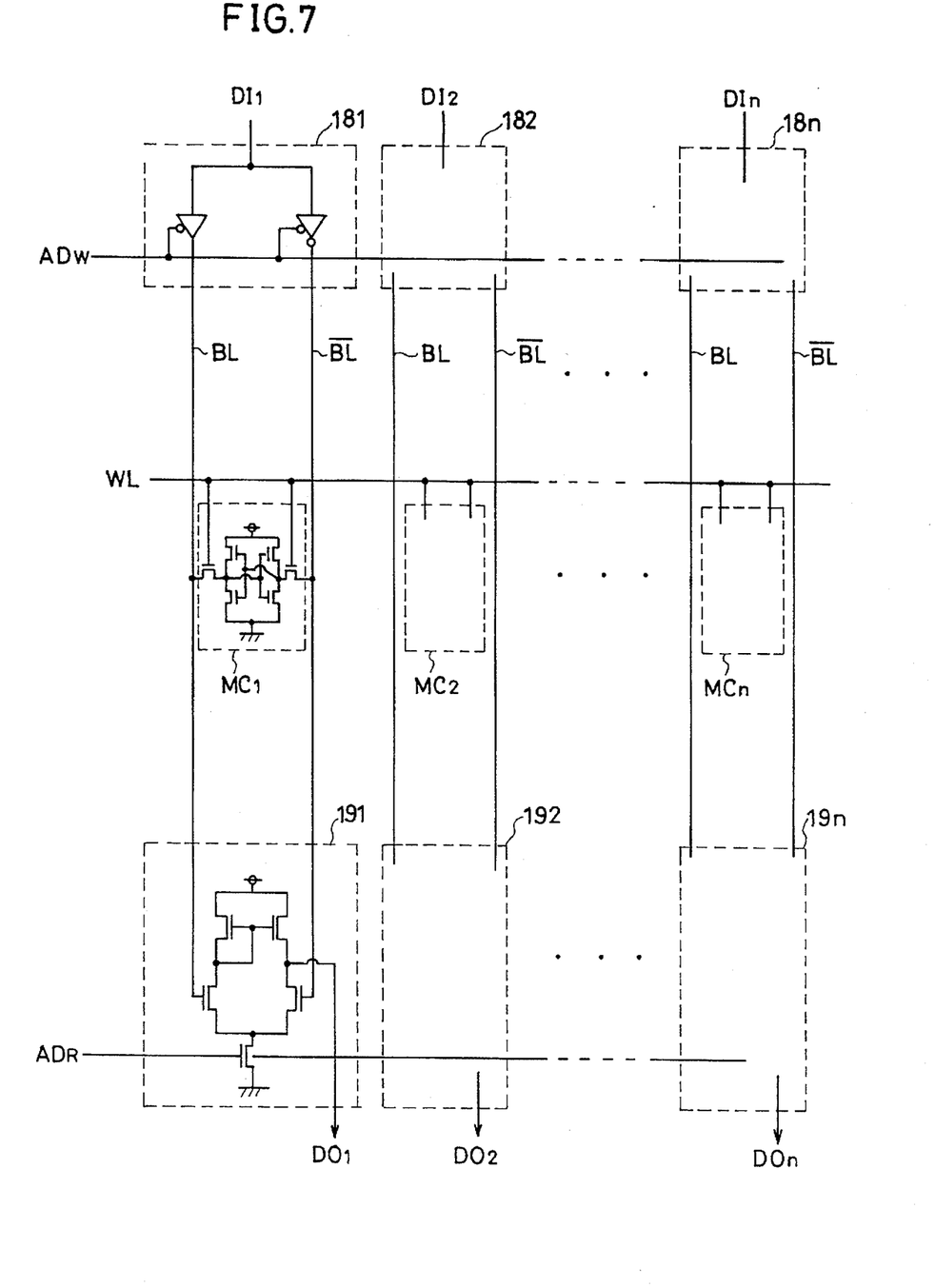
FIG. 7 is a circuit diagram of the bit-line driving circuit and the sense amplifier circuit shown in FIG. 3.

Parts of the bit-line driving circuit 18 and the sense amplifier circuit 19 shown in FIG. 3 are given in FIG. 7. In FIG. 7, there are shown bit-line driving circuits 181 to 18n and sense amplifier circuits 191 to 19n that are provided for accessing one of the columns in the memory cell array 11. Memory cells MC1 to MCn are connected to a word line WL which is driven by the writing row selecting circuit 12 or the reading row selecting circuit 13. The n bit-line driving circuits 181 to 18n are responsive to an enable signal $AD_W$ outputted from one of the programmable flip-flops 23 that constitute the writing column selecting circuit 14 shown in FIG. 3, for driving bit line pairs of BL and $\overline{BL}$. Driven by the bit-line driving circuits 181 to 18n, the bit line pairs receive n bits of input data signals DI1 to DIn from the input data bus.

Similarly, the n sense amplifiers 191 to 19n are responsive to an enable signal $AD_R$ outputted from one of the programmable flip-flops 23 in the reading column selecting circuit 15 shown in FIG. 3, for being enabled, or activated. When the sense amplifiers 191 to 19n are activated, n bits of amplified data signals DO1 to DOn of the corresponding column are outputted.

Figure 8:
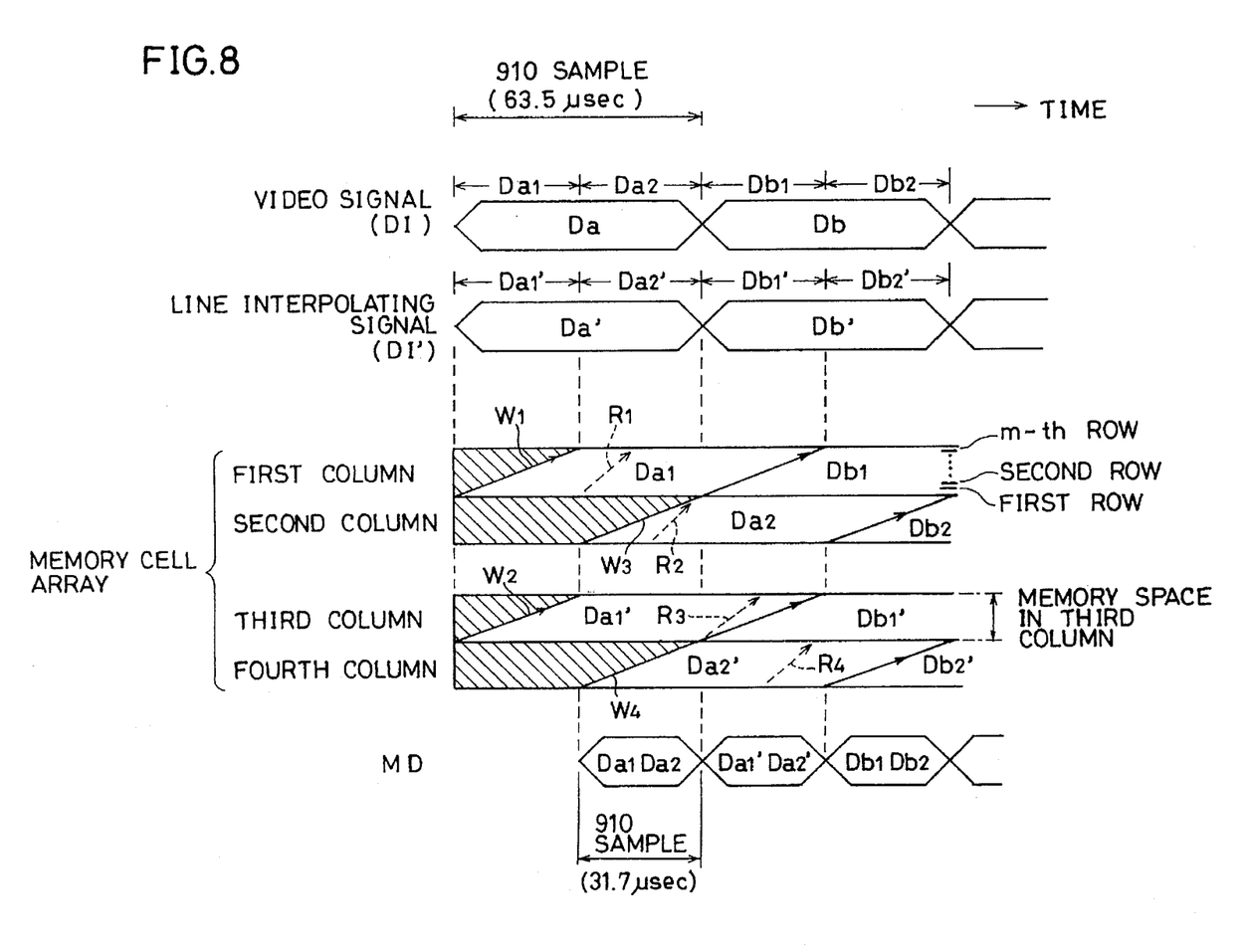
FIG. 8 is a timing chart showing operation of the serial access memory device shown in FIG. 3 when it is applied to a progressive scan conversion circuit.

In the following, an example where the serial access memory device shown in FIG. 3 is applied to video signal processing of an NTSC color television will be described. In this case, the serial access memory device shown in FIG. 3 is applicable as a line memory for progressive scan conversion, operation of which will be described below with reference to FIG. 8. In FIG. 8, the axis of abscissas represents lapse of time. For the data stored in the first to fourth columns, the axis of ordinates schematically represents memory space in the row direction. The solid line arrows W1 to W4 represent the data writing operation. The broken line arrows R1 to R4 represent the data reading operation. The hatching portion represents data remaining in the memory cell array 11 which form the preceding horizontal scanning line.

Assume now that video signals for the NTSC are sampled in response to a sampling frequency of 14.3 $MH_Z$ (equivalent to fourfold the color subcarrier frequency $f_{SC}$). Correspondingly, the memory cell array 11 includes memory cells of n=8, k=455, and m=6, so as to store data forming three horizontal scanning lines.

First, the control signals S1 to S10 shown in the table 2 above are set to the registers in the serial interface circuit 22. The control signals S1 to S4 are applied to the writing column selecting circuit 14 and the reading column selecting circuit 15. As described above, the flip-flops $23_{W1}$ to $23_{W6}$ and $23_{R1}$ to $23_{R6}$ constitute ring pointers shown in FIG. 3. Additionally, the flip-flops $23_{W1}$, $23_{W3}$ and $23_{R1}$ receive the control signal S1 of "H" so that "1" is set to them, in response to application of the reset signals WRST and PRST. Meanwhile, the other flip-flops receive the control signal S1 of "L" so that "0" is set to them. These initial values circulate in the respective ring pointers in response to the clock signals WCLK and RCLK.

Thus, the flip-flops $23_{W1}$ and $23_{W2}$ provided in the writing column selecting circuit 14 output, in response to the writing clock signal WCLK, "H" signals of $AD_{W1}$ and $AD_{W2}$ alternately. The flip-flops $23_{W3}$ and $23_{W4}$ likewise output "H" signals of $AD_{W3}$ and $AD_{W4}$ alternately. Furthermore, the four flip-flops $23_{R1}$ and $23_{R4}$ provided in the reading column selecting circuit 15 output by turns in circles "H" signals of $AD_{R1}$ to $AD_{R4}$.

For the writing clock signal WCLK and the reading clock signal RCLK that are separately applied from the outside for the column selection, one clock pulse is generated in response to generation of k pulses of clock signals (not shown) that are applied to the writing row selecting circuit 12 and the reading row selecting circuit 13, respectively, for the row selection. Additionally, it is to be noted that the reading clock signal RCLK has a frequency twice that of the writing clock signal WCLK for the progressive scan conversion of the video signals. This applies also to the relationship between the writing and reading clock signals for the row selection which are not shown.

Since the control signals S5 to S10 are set as shown in the table 2 above, the input bus selector circuit 20 connects the first and second columns of the memory cell array 11 to the input data bus 16a, as shown in FIG. 3. The input bus selector circuit 20 connects the third and forth columns of the memory cell array 11 to the input data bus 16b. Further, the output bus selector bus 21 connects the output data bus 17a to the first to fourth columns of the memory cell array 11. Accordingly, the input data bus 16c, and the output data buses 17b and 17c are not used in the present embodiment.

After the serial access memory device shown in FIG. 3 has been set as described above, the digital video signals Da and Db shown in FIG. 8 are entered each as an 8-bit digital video signal DI. Each of the data Da and Db corresponds to one horizontal scanning line data. Therefore, in the NTSC method, each of the data Da and Db has sampling number of 910 and a sampling period of about 63.5 μsec. The digital video signals D1s, or data Da and Db are applied to the input data bus 16b shown in FIG. 3. Similarly, a line interpolating signal D1' to be interpolated between the horizontal scanning lines is applied to the input data bus 16b shown in FIG. 3. The line interpolating signal DI' is obtained through arithmetic operation based on image data of one field before or upper or lower adjacent horizontal scanning line data. As the line interpolating signal DI', Da' and Db' are applied to the input data bus 16b as shown in FIG. 8.

After the writing reset signal $\overline{WRST}$ is applied, the video data Da and the line interpolating data Da' are written in the first and third columns of the memory cell array 11, respectively, in response to the writing clock signal WCLK. Since the writing frequency is 14.3 MHz, the writing period is about 63.5 μsec. As shown in FIG. 8, data Da1 corresponding to the first half 455 samples of the video data Da are written in the first column as indicated by the arrow W1. Data Da1' corresponding to the first half 455 samples of the line interpolating data Da' are written in the third column as indicated by the arrow W2. The writing operations indicated by the arrows W1 and W2 are executed at a time and in parallel. After the writing, the second and fourth columns are selected. Data Da2 corresponding to the latter half 455 samples of the video data Da are written in the second column as indicated by the arrow W3. Similarly, data Da2' corresponding to the latter half 455 samples of the line interpolating data Da2' are written in the fourth column as indicated by the arrow W4. The column selection defined by the arrows W1 to W4 above is effected based on the function of the above-described ring pointers as provided in the writing column selecting circuit 14.

After the first half data Da1 and Da1' are written in the first and the third columns, respectively, the reading reset signal $\overline{RRST}$ and the reading clock signal RCLK are applied. Accordingly, the stored data Da1, Da2, Da1', Da2', ... are read out from the first, second, third and fourth columns of the memory cell array 11 in this order, and applied to the output data bus 17a. The reading operation for each column is indicated by the broken line arrows R1, R2, R3 and R4. The column selection for these reading operations is effected based on function of the ring pointer in the reading column selecting circuit 15.

As a result, for one horizontal scanning period (63.5 μsec), data obtained by compressing the video data Da and the line interpolating data Da' in time, or data MD converted for progressive scan are provided as shown in FIG. 8. In other words, on a picture plane of a television to which these converted data MD are applied, the number of the horizontal scanning lines in one field is doubled when compared with the normal case. While the reading operation from the third and fourth columns is executed, or the line interpolating data Da1' and Da2' are being read out as indicated by the arrows R3 and R4, respectively, the video data Db1 and the line interpolating data Db1' of the subsequent horizontal scanning line are written in the first and third columns, respectively. Through repetition of the operation above, the video signal DI and the line interpolating signal DI' can be serially read out at a speed twice that of the writing.

In the above, description has been made on the case where the serial access memory device shown in FIG. 3 is used as a line memory device for progressive scan conversion in an NTSC color television. The serial access memory device according to the present invention can also be used as one horizontal scanning delay line for the R, G and B signals of a color television, or an RGB line memory. Such an application example will be described below with reference to FIGS. 9 and 10. Also in this embodiment, it is assumed that the R, G and B signals are sampled with a sampling frequency of 14.3 MHz. In order to store these three signals in one serial access memory device, the memory cell array shown in FIG. 9 has a circuit structure of n=8, k=455, and m=6. The writing clock signal WCLK and the reading clock signal RCLK have the same frequency.

Figure 9:
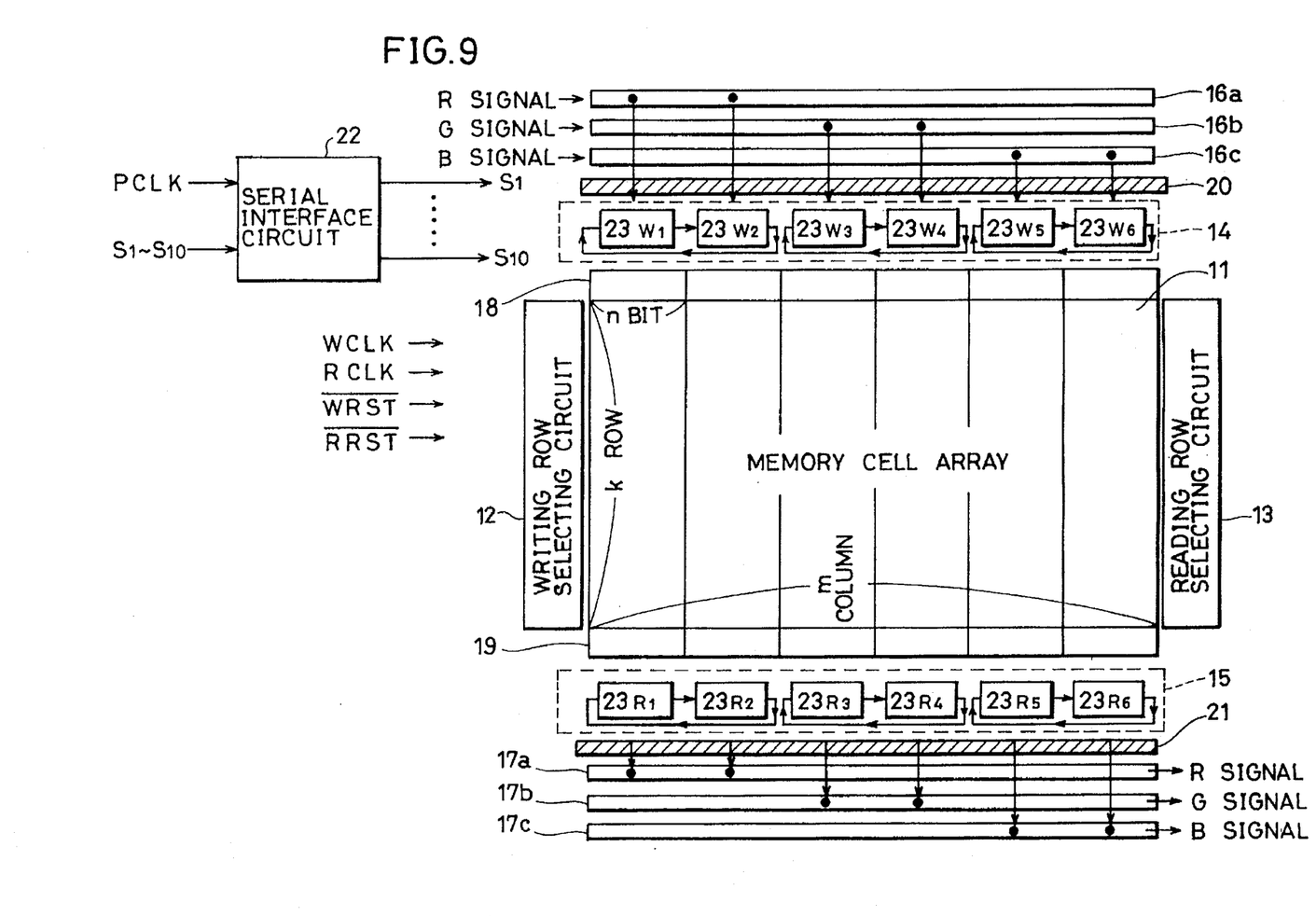
FIG. 9 is block diagram of a serial access memory device according to another embodiment of the present invention.
Figure 10:
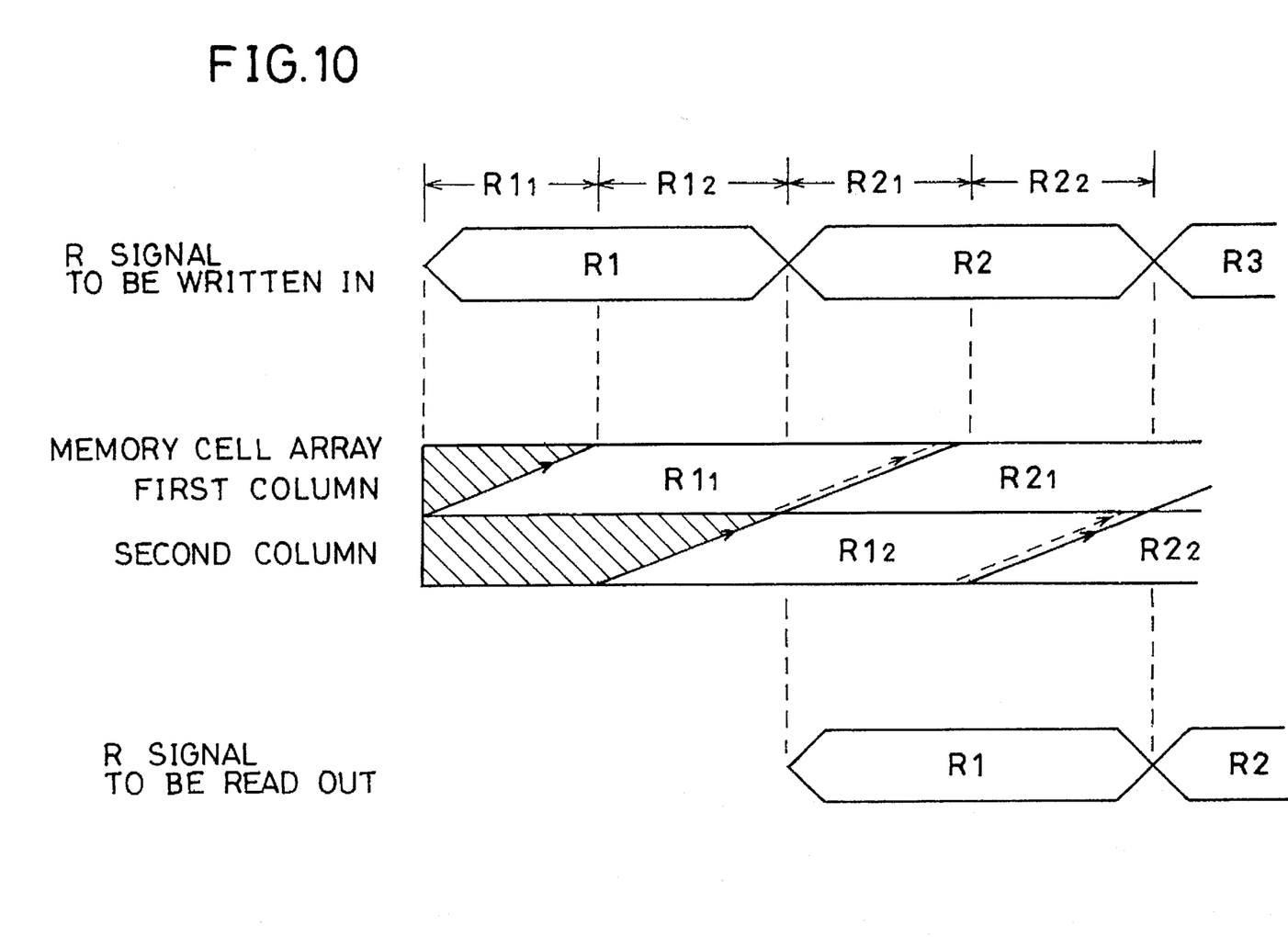
FIG. 10 is a timing chart showing operation of the serial access memory device shown in FIG. 9 when it is applied to a line memory for the R, G and B signals in a color television.

First, the control signal S1 to S10 shown in the following table 3 are programed in the serial interface circuit 22.

TABLE 3

| P. FF | S1 | S2 | S3 | S4 | S5 | S6 | S7 | S8 | S9 | S10 |
|---|---|---|---|---|---|---|---|---|---|---|
| WRITING | | | | | | | | | | |
| 1 column $23_{W1}$ | 1 | 1 | 1 | 0 | 1 | 0 | 0 | | | |
| 2 column $23_{W2}$ | 0 | 1 | 0 | 1 | 1 | 0 | 0 | | | |
| 3 column $23_{W3}$ | 1 | 1 | 1 | 0 | 0 | 1 | 0 | | | |
| 4 column $23_{W4}$ | 0 | 1 | 0 | 1 | 0 | 1 | 0 | | | |
| 5 column $23_{W5}$ | 1 | 1 | 1 | 0 | 0 | 0 | 1 | | | |
| 6 column $23_{W6}$ | 0 | 1 | 0 | 1 | 0 | 0 | 1 | | | |
| READING | | | | | | | | | | |
| 1 column $23_{R1}$ | 1 | 1 | 1 | 0 | | | | 1 | 0 | 0 |
| 2 column $23_{R2}$ | 0 | 1 | 0 | 1 | | | | 1 | 0 | 0 |
| 3 column $23_{R3}$ | 1 | 1 | 1 | 0 | | | | 0 | 1 | 0 |
| 4 column $23_{R4}$ | 0 | 1 | 0 | 1 | | | | 0 | 1 | 0 |
| 5 column $23_{R5}$ | 1 | 1 | 1 | 0 | | | | 0 | 0 | 1 |
| 6 column $23_{R6}$ | 0 | 1 | 0 | 1 | | | | 0 | 0 | 1 |

Therefore, as shown in FIG. 9, the programmable flip-flops $23_{W1}$ to $23_{W6}$ provided in the writing column selecting circuit 14 constitute three ring pointers. More specifically, a ring pointer constituted of the flip-flops $23_{W1}$ and $23_{W2}$ alternately selects the first and second columns in the memory cell array 11. Another ring pointer constituted of the flip-flops $23_{W3}$ and $23_{W4}$ alternately selects the third and fourth columns in the memory cell array 11. Still another ring pointer constituted of the flip-flops $23_{W5}$ and $23_{W6}$ alternately selects the fifth and sixth columns. Similarly, the programmable flip-flops $23_{R1}$ to $23_{R6}$ provided in the reading column selecting circuit 15 also constitute three ring pointers.

The input bus selector circuit 20 connects, according to the control signals S5 to S7 stored in the serial interface circuit 22, the input data buses 16a, 16b and 16c to the first and second, to the third and fourth, and to the fifth and sixth columns of the memory cell array 11, respectively. Similarly, the output bus selector circuit 21 connects, according to the control signals S8 to S10 programmed in the serial interface circuit 22, the output data buses 17a, 17b and 17c to the first and second, to the third and fourth, and to the fifth and sixth columns of the memory cell array 11, respectively.

In operation, when the writing reset signal $\overline{WRST}$ falls, the flip-flops $23_{W1}$, $23_{W3}$ and $23_{W5}$ are selected. When the writing reset signal $\overline{WRST}$ rises, the flip-flops $23_{W2}$, $23_{W4}$ and $23_{W6}$ are selected in response to the writing clock signal WCLK for the column selection. Thereafter, in response to the writing clock signal WCLK, a group of the flip-flops $23_{W1}$, $23_{W3}$ and $23_{W5}$ and another group of the flip-flops $23_{W2}$, $23_{W4}$ and $23_{W6}$ are alternately selected. This selecting operation continues until the writing reset signal $\overline{WRST}$ is applied again. The flip-flops $23_{R1}$ to $23_{R6}$ in the reading column selecting circuit 15 operate in the same manner.

Data for the R, G and B signals that form horizontal scanning line data are applied to the input data buses 16a, 16b and 16c. More specifically, data R1, R2, ... for the R signal are applied to the input data bus 16a. Data G1, G2, ... for the G signal are applied to the input data bus 16b. Data B1, B2, ... for the B signal are applied to the input data bus 16c. After the writing reset signal $\overline{WRST}$ is applied, the data R1, G1 and B1 are written in the first, third, and fifth columns of the memory cell array 11, respectively, in response to the writing clock signal WCLK. In this case also, the writing frequency is 14.3 MHz. While in FIG. 10, processing for the R signal only is shown, the same processing is performed at the time and in parallel, also for the G and B signals.

When the first, third and fifth columns of the memory cell array 11 are selected by the writing column selecting circuit 14, data $R1_1$, $G1_1$ and $B1_1$ corresponding to the first half 455 samples of the respective signals are written in the first, third and fifth columns, respectively. Subsequently, when the second, fourth and sixth columns of the memory cell array 11 are selected, data $R1_2$, $G1_2$ and $B1_2$ corresponding to the latter half 455 samples of the respective signals are written in the second, fourth and sixth columns, respectively.

After the latter half 455 sample data $R1_2$, $G1_2$ and $B1_2$ are written in the respective columns, the reading reset signal $\overline{RRST}$ is applied. The reading column selecting circuit 15 first, in response to the reading clock signal RCLK, selects the first, third and fifth columns of the memory cell array 11 so that the first half data $R1_1$, $G1_1$ and $B1_1$ are read out. Subsequently, the second, fourth and sixth columns are selected, from which the latter half data $R1_2$, $G1_2$ and $B1_2$ are read out. The read-out data are applied to the output data bus 17a, 17b and 17c. Consequently, the written data R1, G1 and B1 are delayed by a time required for the row selection by the writing row selecting circuit 12 and the reading row selecting circuit 13 to go through two cycles, or by one horizontal scanning period. After the latter half data $R1_2$, $G1_2$ and $B1_2$ are read out from the second, fourth and sixth columns, respectively, the first half sample data $R2_1$, $G2_1$ and $B2_1$ of the subsequent horizontal scanning line are written in the first, third and fifth columns, respectively. Through repetition of the operation above, the R, G and B signals are delayed by one horizontal scanning period.

In the embodiment above, any of the columns in the memory cell array 11 is selected by the writing column selecting circuit 14 and the reading column selecting circuit 15 each comprised of the programmable flip-flops 23. On the other hand, it is to be noted that instead of the column selection, the row selection can also be controlled with the writing row selecting circuit 12/the reading row selecting circuit 13 comprised of the programmable flip-flops 23. In other words, with the provision of ring pointers which separately control the columns in the memory cell array 11, the same effects as described above can be obtained.

According to the above embodiments, circuit connection of the programmable flip-flops 23 in the column selecting circuits 14 and 15 is controlled by programming the control signals in the shift registers in the serial interface circuit 22. Meanwhile, a read only memory (ROM) can also be applied as the serial interface circuit 22.

Furthermore, while according to the embodiments above, the selecting circuits 14 and 15 are employed for selecting both writing and reading columns, it may also be possible to provide only one selecting circuit which selects either writing or reading columns as desired.

As has been described above, the serial access memory device shown in FIG. 3 is applied to a progressive scan conversion circuit for video signal processing. When compared with the conventional progressive scan conversion circuit shown in FIG. 2, it is to be noted that the serial access memory device in FIG. 3 does not require the two switching circuits 9 and 10 so that its circuit structure and switching control are simplified. Additionally, it is to be noted that the required memory capacity is reduced to half that of the circuit shown in FIG. 2. Furthermore, the remaining memory cell columns, or the fifth and sixth memory cell columns in FIG. 3 can serve as redundancy circuits for the first to fourth memory cell columns. This will result in an improved productive efficiency, or yield of the serial access memory device. Meanwhile, it is to be noted that the serial access memory device shown in FIG. 9 constitutes a line memory device for the R, G and B signals on a single chip.

In the serial access memory devices shown in FIGS. 3 and 9, the writing column selecting circuit 14 and the reading column selecting circuit 15 are comprised of ring pointers having a controllable number of stages. That is, in response to the control signals S1 to S4 programmed in the serial interface circuit 22, the number of stages the ring pointers in the respective selecting circuits 14 and 15 is controlled. The ring pointers with the controlled number of stages enable or activate accessing circuits, or the bit-line driving circuit 18 and the sense amplifier circuit 19. Accordingly, the order of access to the memory cell columns, or memory cell areas is controlled based on the function of the controlled ring pointers. This provides the advantage of flexible use of the memory cell areas in the serial access memory device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A serial access memory device, comprising:
   a memory cell array having a plurality of separately accessible memory cell areas; each said area having memory cells disposed therein to store data signals;
   a plurality of access means respectively connected to corresponding memory cell areas for accessing data signals stored in memory cells of said respective memory cell areas;
   a plurality of activating means each connected to a corresponding one of said plurality of access means and responsive to a clock signal for activating said corresponding one of said plurality of access means; and select signal storing means for storing a selecting signal and generating a plurality of control signals determined by said selecting signal;

each said activating means comprising selective coupling means responsive to said control signals generated by said select signal storing means for selectively coupling at least two of said plurality of activating means in a predetermined configuration selected for successively activating at least two corresponding access means in response to said clock signal.

2. The serial access memory device according to claim 1, wherein
said plurality of memory cell areas comprise a plurality of separately accessible memory cell columns.

3. The serial access memory device according to claim 1, wherein
said plurality of activating means are arranged to provide a ring pointer means operative in response to said clock signal.

4. The serial access memory device according to claim 2, wherein
said plurality of access means comprise a plurality of writing means each respectively connected to a corresponding one of said memory cell columns for writing data signals into the memory cells of said corresponding memory cell column.

5. The serial access memory device according to claim 2, wherein
said plurality of access means comprise a plurality of reading means each respectively connected to a corresponding one of said memory cell columns for reading stored data signals from the memory cells of said corresponding memory cell column.

6. The serial access memory device according to claim 4, wherein
said memory cell array comprises a plurality of bit lines each connected to memory cells of one of said plurality of memory cell columns to transmit data signals of the memory cells of said corresponding memory cell column, and
said plurality of writing means comprise a plurality of bit-line driving means each respectively connected to a corresponding one of said plurality of bit lines for driving the corresponding bit line in response to the data signals to be written in the memory cells of said corresponding memory cell column.

7. The serial access memory device according to claim 5, wherein
said memory cell array comprises a plurality of bit lines each connected to memory cells of one of said plurality of memory cell columns to transmit data signals of the memory cells of said corresponding memory cell column, and
said plurality of reading means comprise a plurality of amplifying means each respectively connected to a corresponding one of said plurality of bit lines to amplify data signals on the corresponding bit line read from the memory cells of said corresponding memory cell column.

8. The serial access memory device according to claim 1, wherein
said select signal storing means comprises shift register means responsive to an externally applied second clock signal for holding an externally applied selecting signal.

9. The serial access memory device according to claim 3, wherein
each of said plurality of activating means comprises cascaded master latch means and slave latch means which are operative in response to the clock signal.

10. A serial access memory device for converting first and second digital video data for progressive scan, comprising:
a memory cell array having four memory cell columns each having n memory cells disposed in k rows, where n and k are integers greater than one;

four writing means each respectively connected to a corresponding one of said four memory cell columns for writing one of the first or second video data in memory cells of said corresponding memory cell column;

first selecting means responsive to an externally applied first clock signal for alternately selecting a predetermined two of said four writing means;

said writing means selected by said first selecting means writing said first video data into memory cells of at least a first corresponding memory cell column;

second selecting means responsive to said externally applied first clock signal for alternately selecting the remaining two of said four writing means;

said writing means selected by said second selecting means writing said second video data into memory cells of at least a second corresponding memory cell column;

four reading means each respectively connected to a corresponding one of said four memory cell columns for reading stored data from memory cells therein; and third selecting means responsive to an externally applied second clock signal for successively selecting individual ones of said four reading means, said second clock signal having a frequency twice that of said first clock signal, and said reading means selected by said third selecting means respectively reading data stored in the memory cells of said memory cell column corresponding thereto.

11. The serial access memory device according to claim 10, wherein
said first selecting means comprises first ring pointer means having two stages, said first ring pointer means responsive to the first clock signal for operation,
said second selecting means comprises second ring pointer means having two stages, said second ring pointer means responsive to the first clock signal for operation, and
said third selecting means comprises third ring pointer means having four stages, said third ring pointer means responsive to the second clock signal for operation.

12. The serial access memory device according to claim 10, wherein
the first digital video data comprise NTSC video data,
the second digital video data comprise line interpolating data,
n equals 8, and
k equals 455.

13. A serial access memory device for delaying at least first and second serial data, comprising:
a memory cell array having m memory cell columns each having n memory cells disposed in k rows, where m, n and k are integers greater than one;
m writing means each respectively connected to a corresponding one of said m memory cell columns for writing one of the first or second serial data in memory cells of said corresponding memory cell column;

first serial selecting means responsive to an externally applied first clock signal for successively selecting a predetermined i out of said m writing means, where i is an integer, said i writing means selected by said first serial selecting means each respectively writing said one of said first and second serial data into memory cells of a memory cell column corresponding thereto;

second serial selecting means responsive to said first clock signal for successively selecting i out of the remaining (m-i) of said m writing means, said i writing means selected by said second serial selecting means each respectively writing the other of said first and second serial data into memory cells of a memory cell column corresponding thereto;

m reading means each respectively connected to a corresponding one of said m memory cell columns for reading stored data from memory cells in said corresponding memory cell column;

third serial selecting means synchronized with said first serial selecting means for successively selecting corresponding i reading means, said i reading means selected by said third serial selecting means each respectively reading stored data from memory cells of the memory cell column corresponding thereto; and fourth serial selecting means synchronized with said second serial selecting means for successively selecting corresponding i reading means, said reading means selected by said fourth serial selecting means each respectively reading stored data from memory cells of the memory cell column corresponding thereto.

14. The serial access memory device according to claim 13, wherein said at least first and second serial data comprise a digital R signal, a digital D signal and a digital B signal contained in video signals.

15. The serial access memory device according to claim 14, further comprising:

a line memory for delaying said three digital signals on horizontal scanning lines.

16. The serial access memory device according to claim 15, wherein said video signals are NTSC standard video signals,
i equals 2,
k equals 455,
m equals 6, and
n equals 8.

17. The serial access memory device according to claim 1, wherein said plurality of activating means are arranged to provide a ring pointer, each said activating means comprising programmable flip flop means.

18. The serial access memory device according to claim 17, wherein said ring pointer comprises a sequence of programmable flip flop means, each said programmable flip flop means comprises:

first input means for receiving a forward signal from a preceding programmable flip flop in said ring pointer;

first output means for providing a forward signal to a subsequent programmable flip flop in said ring pointer;

second input means for receiving a returning signal from said subsequent programmable flip flop;

second output means for providing a returning signal to said preceding programmable flip flop; and path selecting means responsive to said control signals generated by said select signal storing means for establishing a connection path between a selected one of said first and second input means and a selected one of said first and second output means, whereby a plurality of said programmable flip flop means are connected in a ring pointer means wherein a data bit circulates in accordance with said first clock signal.

19. The serial access memory device according to claim 18, wherein each said programmable flip flop means further comprises additional output means for providing an output signal to activate said corresponding one of said plurality of access means, whereby programmed sequences of said access means are successively activated in accordance with a sequence of said programmable flip flops formed into said ring pointer means in accordance with said control signals generated by said select signal storing means.

20. A serial access memory device, comprising:

a memory cell array having a plurality of separately accessible memory cell areas; each said area having memory cells disposed therein to store data signals;

a plurality of access means each respectively connected to a corresponding one of said plurality of memory cell areas for accessing memory cells in said corresponding one of said plurality of memory cell areas;

a plurality of activating means each respectively connected to a corresponding one of said plurality of access means and responsive to a clock signal for activating said corresponding one of said plurality of access means; and select signal storing means for storing a selecting signal and generating a plurality of control signals determined by said selecting signal;

said activating means comprising selective coupling means responsive to said control signals generated by said select signal storing means for selectively coupling said plurality of activating means in predetermined circuit configurations.

21. A serial access memory device comprising:

a memory array having a plurality of separately accessible memory cell areas, each said area having a plurality of memory cells and bit lines connected to said plurality of memory cells;

a plurality of data lines;

a plurality of access means respectively connected between respective bit lines of a corresponding memory cell area and a corresponding data line for transferring data between said corresponding data line and said respective bit lines of said corresponding memory cell area;

a plurality of activating means each responsive to a clock signal for generating an activating signal for activating a corresponding one of said plurality of access means; and select signal generating means for generating a plurality of control signals; wherein each said activating means comprises,
first and second input terminals,
first and second output terminals, an activating signal generating means for generating said activating signal, said activating signal generating means having an input node and an output node, and path selecting means for selecting one of said input terminals and one of said output terminals to form a path for transfer of said activating signal between connected ones of said activating means, said path selecting means comprising first and second switching means;

said first switching means responsive to at least one of said plurality of control signals for connecting an input node of said activating signal generating means to a selected one of said first and second input terminals; and said second switching means responsive to at least one of said plurality of control signals for connecting an output node of said activating signal generating means to a selected one of said first and second output terminals, whereby said activating signal is selectively transferred from a selected input terminal through said activating signal generating means to a selected output terminal.

22. A serial access memory device according to claim 21, wherein said path selecting means further comprises third switching means responsive to at least one of said plurality of control signals for connecting said input node to said output node through said first and second switching means.

23. A serial access memory device according to claim 21 wherein said path selecting means further comprises third switching means responsive to at least one of said plurality of control signals for connecting the input node to the output node of said activating signal generating means.

24. A serial access memory device according to claim 23 wherein said path selecting means further comprises a fourth switching means cooperating with said third switching means for connecting at least one of said input terminals to at least one of said output terminals and for bypassing the input and output nodes of said activating signal generating means.

* * * * *